United States Patent [19]

Leslie

[11] 4,367,422
[45] Jan. 4, 1983

[54] POWER ON RESTART CIRCUIT
[75] Inventor: Samuel A. Leslie, Forest, Va.
[73] Assignee: General Electric Company, Lynchburg, Va.
[21] Appl. No.: 192,936
[22] Filed: Oct. 1, 1980
[51] Int. Cl.³ .................... H03K 17/22; H03K 17/28; H03K 5/153
[52] U.S. Cl. .................. 307/597; 307/363; 307/592; 328/48; 340/636
[58] Field of Search .............. 307/592, 594, 597, 354, 307/362, 363, 246; 328/48; 340/663, 636; 361/89, 92; 365/226, 228; 368/66, 249

[56] References Cited
U.S. PATENT DOCUMENTS

| | | | |
|---|---|---|---|
| 3,504,196 | 3/1970 | Thompson | 307/363 X |
| 3,535,560 | 10/1970 | Cliff | 307/296 |
| 3,895,239 | 7/1975 | Alaspa | 307/594 |
| 3,950,654 | 4/1976 | Broedner et al. | 307/594 X |
| 4,001,609 | 1/1977 | Sickert | 307/296 X |
| 4,004,163 | 1/1977 | Spence | 307/246 X |
| 4,013,902 | 3/1977 | Payne | 307/268 |
| 4,035,669 | 7/1977 | Yokoyama | 307/603 |
| 4,045,688 | 8/1977 | Stewart | 307/585 |
| 4,103,187 | 7/1978 | Imamura | 307/585 |
| 4,140,930 | 2/1979 | Tanaka | 307/594 X |
| 4,224,539 | 9/1980 | Musa et al. | 340/636 X |
| 4,260,907 | 4/1981 | Winebarger | 328/48 X |
| 4,296,338 | 10/1981 | Thomas | 307/594 X |

FOREIGN PATENT DOCUMENTS

| | | | |
|---|---|---|---|
| 54-158843 | 12/1979 | Japan | 307/592 |
| 55-47727 | 4/1980 | Japan | 307/594 |

OTHER PUBLICATIONS

RCA—Technical Notes; TN No 927, Entitled: "Turn-On" Reset Pulse Circuits by George D. Hanchett.

Primary Examiner—Larry N. Anagnos
Attorney, Agent, or Firm—Cushman, Darby & Cushman

[57] ABSTRACT

A power on reset circuit providing a reset signal to a microprocessor-based system upon its initial power up and a reinitializing reset signal in response to low voltage power supply transients.

11 Claims, 1 Drawing Figure

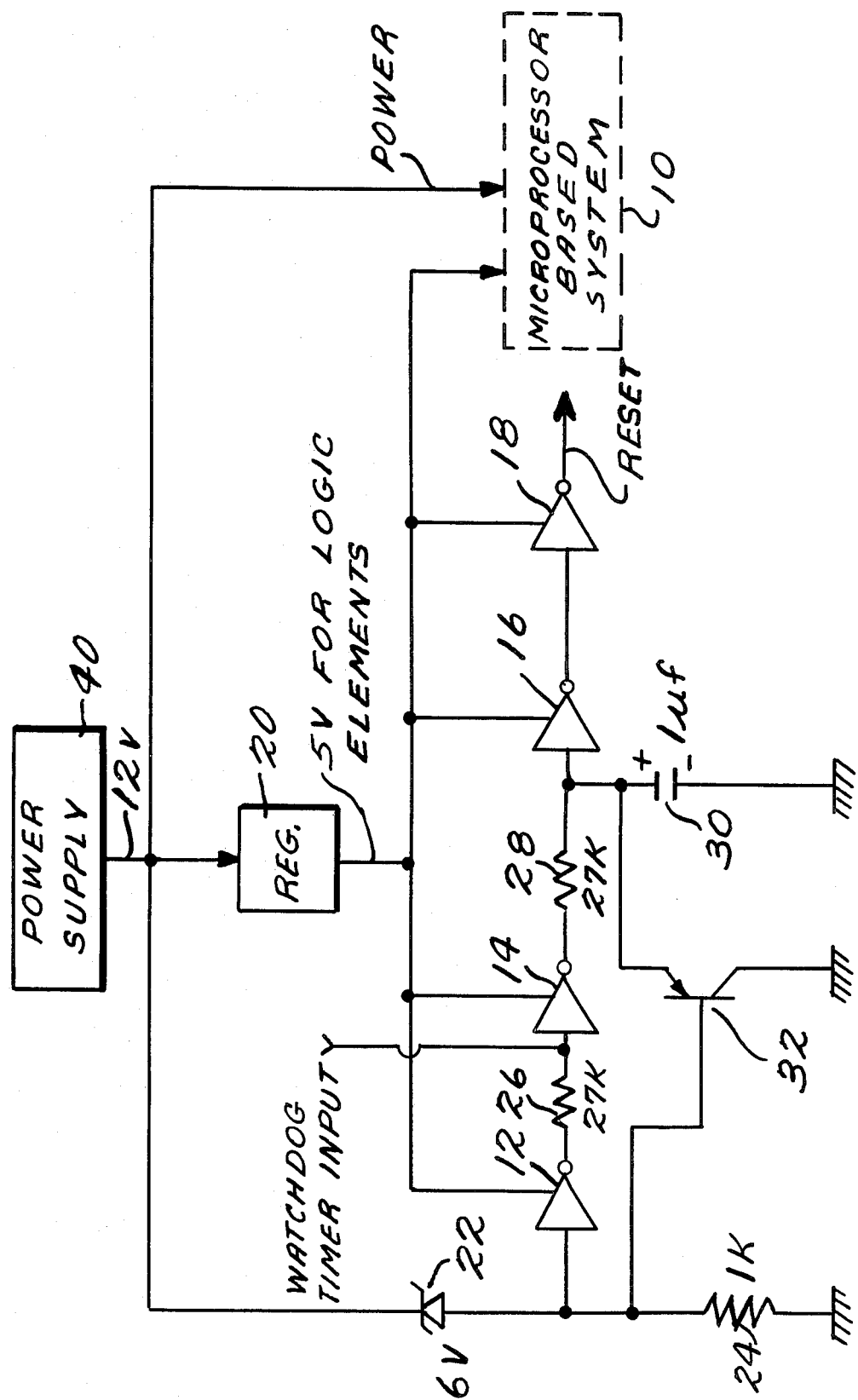

POWER ON RESTART CIRCUIT

BACKGROUND OF THE INVENTION

This invention relates in general to power on reset circuits for use in initializing microprocessor-based systems.

When operating microprocessor-based systems, it is necessary to provide a logic reset signal to initialize the microprocessor when power is first applied. Various reset circuits for providing this initializing reset signal are known. However, known power on reset circuits consume considerable power when operating which is a disadvantage.

In addition, it is advantageous to provide a reliable reset pulse to re-initialize the microprocessor whenever a power line transient or momentary power outage occurs. Known power-on reset circuits for providing such protection are highly complex and/or are available only in the form of an integrated circuit, such as that shown in U.S. Pat. No. 4,013,902—Payne (Mar. 22, 1977). Simple independently adjustable circuitry for providing both initialization at first power "on" and re-initialization reset signals in response to low voltage power transients are believed to be unavailable.

SUMMARY OF THE INVENTION

Therefore, there is provided a power on reset circuit for generating a reset pulse for initializing a microprocessor-based system upon first power "on" and for generating a reset pulse in response to a low voltage power transient to re-initialize the system. The low voltage threshold and the duration of the reset pulses provided are easily changed so that the circuit is flexible, i.e. it is easily adaptable from system to system. Furthermore, the reset circuit draws little operating current compared to conventional reset circuits.

The circuit includes means for providing a threshold voltage related to the power supply voltage; a first inverter having an input coupled to the threshold voltage and having an output; a second inverter; a resistor coupling the output of the first inverter to the input of the second inverter; a third inverter; a second resistor coupling the output of the second inverter to the input of a third inverter; a capacitor, coupled from the input of the third inverter to circuit ground; transistor circuit means, coupled to the threshold voltage and to the input of the third inverter, for rapidly discharging the capacitor when the threshold voltage falls below the voltage on said capacitor by a predetermined amount; and a fourth inverter, having an input coupled to the output of the third inverter, and having an output for providing the reset pulses.

BRIEF DESCRIPTION OF THE DRAWING

The invention will become better understood by the following detailed description and its appended claims when read with reference to the sole FIGURE.

The sole FIGURE is a detailed schematic diagram of the preferred embodiment of the reset circuit according to the present invention.

DETAILED DESCRIPTION OF THE PREFERRED EMBODIMENT

Referring now to the sole FIGURE, there is shown a detailed schematic diagram of the reset circuit according to the present invention. The reset circuit provides a logic level "0" (low) pulse to reset a microprocessor-based system 10. This reset signal is provided upon first power up and whenever there is a low voltage power transient from a power supply 40 providing power to a microprocessor-based system 10, i.e., whenever the power supply voltage drops below a predetermined threshold level.

All values shown in the FIGURE represent values for a CMOS implementation. However, by appropriate adjustment, and the use of appropriate active devices, the circuit is easily adapted to other types of technology.

The reset circuit includes four CMOS inverters 12, 14, 16, and 18 respectively. Logic power (5 volts) is obtained from a regulator 20 coupled to power supply 40. A threshold voltage is established by a voltage divider comprising a Zener diode 22 and resistor 24. This threshold voltage is coupled to the input of an inverter 12. By using a Zener diode in the voltage divider, the input voltage to inverter 12 will track the output voltage of power supply 40. Zener diode 22 is a six (6) volt diode for typical CMOS operation.

The output of inverter 12 is coupled to the input of a second inverter 14 via a resistor 26. A watchdog timer input can be coupled directly to the input of inverter 14. The output of inverter 14 is coupled through a resistor 28 to the input of a third inverter 16. A capacitor 30 couples the input of inverter 16 to circuit ground. The output of inverter 16 is coupled directly to the input of a fourth inverter 18 which provides, at its output, the reset pulses for microprocessor-based system 10.

A transistor 32 has its emitter-collector path coupled in parallel with capacitor 30. The base of transistor 32 is coupled to the input of inverter 12 so that it will respond to the difference in voltage between that of capacitor 30 and the threshold voltage established by the voltage divider including Zener diode 22 and resistor 24.

When power has been off for a sustained period of time, capacitor 30 is at zero voltage. When power is applied and the power supply voltage increases, the voltage to the input of inverter 12 crosses the CMOS threshold (about 3 volts) when voltage of power supply 40 exceeds approximately +9 volts. When the CMOS threshold of inverter 12 is exceeded, a logic level "0" (low) appears at the output thereof, forcing the output of inverter 14 to go high. When the output of inverter 14 goes high, capacitor 30 charges through resistor 28. The finite time delay provided by the time constant of resistor 28 and capacitor 30 causes a logic level low reset signal to appear at the output of inverter 18 for a predetermined interval of time, on the order of a few milliseconds. Of course, logic power will have already been provided to microprocessor-based system 10 and therefore, the reset signal at the output of inverter 18 will reset the microprocessor-based system to its appropriate initialized state during the time the reset line is held low.

After normal operation, there may come a time at which power supply voltage is interrupted. As power supply voltage falls, the voltage at the input of inverter 12 and the base of transistor 32 tracks closely the voltage drop of the power supply. Transistor 32 rapidly discharges capacitor 30 and thereby causes a logic "1" level (high) signal to appear at the output of inverter 16 which in turn causes a logic level "0" (low) signal to appear at the output of inverter 18. Capacitor 30 holds the output reset line low for a predetermined interval of time on the order of a few milliseconds while power is being reapplied through the 12-volt and 5-volt power supply lines.

Resistor 24 provides a load for Zener diode 22 so that a well defined voltage threshold is established at the input of inverter 12 and transistor 32.

Thus, there is provided a reset circuit providing a reset pulse of predetermined interval of time at initial power up of a microprocessor-based system and also provides a reset pulse upon a low voltage power supply transient for re-initializing the system. The reset circuit utilizes high impedance CMOS devices which in turn permit the use of a small capacitor 30 and a small inexpensive transistor 32 for providing rapid discharge of the capacitor.

I claim:

1. A circuit for protecting a microprocessor-based system from low voltage transients of a power supply and for initializing it, upon power on, by providing a reset signal, having a predetermined minimum duration, to the microprocessor-based system comprising:

means for providing a threshold voltage related to said power supply voltage;

a first inverter having an input coupled to said threshold voltage means for providing a logic level "low" signal at an output thereof whenever the threshold voltage rises above a predetermined level;

a second inverter having an input coupled to the output of the first inverter for inverting the logic signal provided by the first inverter;

a third inverter coupled to the output of said second inverter through a first resistor;

a capacitor, coupled from the input of said third inverter to circuit ground;

transistor circuit means having an input coupled in circuit so as to receive said threshold voltage and having an output coupled to said input of said third inverter, for discharging said capacitor when said threshold voltage falls below the voltage on said capacitor by a predetermined amount; and a fourth inverter, having an input coupled to the output of said third inverter, and having an output for providing said reset signal which has a duration that is at least in part a function of the time constant of the RC circuit including said first resistor and said capacitor.

2. A circuit according to claim 1 wherein said means for providing a threshold voltage is a voltage divider.

3. A circuit according to claim 2 wherein said voltage divider includes a Zener diode.

4. A circuit according to claim 1 wherein said transistor circuit means comprises a transistor having its base coupled to said threshold voltage, and its emitter-collector path coupling said capacitor to circuit ground.

5. A circuit according to claim 1 further comprising a second resistor coupling the output of said first inverter to the input of said second inverter and wherein the input of said second inverter is connectable to receive a watchdog timer input.

6. A circuit for protecting a microprocessor-based system during operation from low voltage transients of a power supply and for initializing said system upon applying power to the system, by providing a reset signal having a desired time duration, to the microprocessor-based system, said circuit comprising:

means for providing a threshold voltage related to the voltage of said power supply;

first means comprising an input coupled to said threshold voltage means for providing a first logic level signal at its output whenever the threshold voltage changes in a predetermined direction with respect to a predetermined level;

means for initiating and terminating said reset signal upon initial application of power to said system and also in response to low voltage transients including a second means comprising an input coupled to the output of said first means through a resistance element, a capacitance element, coupled to said input of said second means for charging in response to said first logic signal and circuit means, coupled to said threshold voltage means and to said input of said second means, for discharging said capacitance element when said threshold voltage falls below the voltage on said capacitor by a predetermined amount;

said reset signal having a duration that is at least in part a function of the time constant of an RC circuit comprising said resistance element and said capacitance element.

7. A circuit according to claim 6 wherein said threshold voltage means comprises a divider circuit including a fixed resistor and a zener diode.

8. A circuit according to claim 6 wherein said first means comprises a first inverter having an input coupled to said threshold voltage means and a second inverter, having an input coupled to an output of said first inverter, for providing said first logic level signal.

9. A circuit according to claim 6 wherein said second means comprises an inverter.

10. A circuit according to claim 6 wherein said circuit means comprises a transistor switch.

11. Apparatus for initializing a microprocessor-based system upon initial supply of operating voltage from an electrical power supply and upon the subsequent occurrence of transient interruptions in such operating voltage by providing a reset signal having a desired time duration, said apparatus comprising:

a resistor and a capacitor connected to provide a capacitor charging/discharging circuit having a predetermined RC time constant;

threshold voltage detection means connected for detecting a predetermined level of said supplied operating voltage in excess of a predetermined level and to begin charging said capacitor charging/discharging circuit in response thereto;

voltage following means connected to said capacitor charging/discharging circuit for substantially lowering said RC time constant and thus discharging said circuit in response to transient interruptions in the supplied operating voltage; and means for initiating and terminating said reset signal upon initial application of operating voltage to said system and upon subsequent occurrence of low voltage transients including signal output means connected to supply said reset signal in response to the voltage developed across said capacitor.

* * * * *